United States Patent
Sauer et al.

(10) Patent No.: US 9,160,303 B2
(45) Date of Patent: Oct. 13, 2015

(54) COMPONENT WORKING WITH ACOUSTIC WAVES HAVING REDUCED TEMPERATURE COEFFICIENT OF FREQUENCIES AND METHOD FOR PRODUCING SAME

(75) Inventors: Wolfgang Sauer, Taufkirchen (DE); Andreas Bergmann, Haiming (DE); Michael Jakob, Munich (DE); Markus Mayer, Taufkirchen (DE); Karl-Christian Wagner, Unterhaching (DE); Ulrich Knauer, Munich (DE)

(73) Assignee: EPCOS AG, Munich (DE)

( * ) Notice: Subject to any disclaimer, the term of this patent is extended or adjusted under 35 U.S.C. 154(b) by 300 days.

(21) Appl. No.: 13/814,906

(22) PCT Filed: Jul. 25, 2011

(86) PCT No.: PCT/EP2011/062754
§ 371 (c)(1),
(2), (4) Date: Apr. 29, 2013

(87) PCT Pub. No.: WO2012/019904
PCT Pub. Date: Feb. 16, 2012

(65) Prior Publication Data
US 2013/0200960 A1    Aug. 8, 2013

(30) Foreign Application Priority Data
Aug. 12, 2010 (DE) .......................... 10 2010 034 121

(51) Int. Cl.
*H03H 9/54*    (2006.01)
*H03H 3/10*    (2006.01)
*H03H 9/02*    (2006.01)
(Continued)

(52) U.S. Cl.
CPC . *H03H 9/54* (2013.01); *H03H 3/10* (2013.01); *H03H 9/02094* (2013.01); *H03H 9/02559* (2013.01); *H03H 9/02818* (2013.01); *H03H 9/02834* (2013.01); *H03H 9/1452* (2013.01);
(Continued)

(58) Field of Classification Search
CPC .......... H03H 9/72; H03H 7/46; H03H 9/725; H03H 9/02559; H03H 9/14505
See application file for complete search history.

(56) References Cited

U.S. PATENT DOCUMENTS 6,313,715 B1 * 11/2001 Bergmann et al. ............ 333/133
7,345,409 B2     3/2008 Leidl et al.
(Continued)

FOREIGN PATENT DOCUMENTS

DE         103 52 640 A1    6/2005
DE   10 2006 010 752 A1    9/2007
(Continued)

OTHER PUBLICATIONS

Abbott, B., et al., "Theoretical Investigation into Spurious Modes Content in SAW Devices with a Dielectric Overcoat," Fourth International Symposium on Acoustic Wave Devices for Future Mobile Communication Systems, 2010, 11 pages.
(Continued)

*Primary Examiner* — John Poos
(74) *Attorney, Agent, or Firm* — Slater & Matsil, L.L.P.

(57) ABSTRACT

A component is designed to work with acoustic waves. Embodiments have an improved temperature gradient of the frequency range and have increased performance strength. To this end, the component includes a stack of layers having a lower bonding layer, an electrode layer, an upper bonding layer, a compensation layer, and a trimming layer.

15 Claims, 3 Drawing Sheets

(51) Int. Cl.
  *H03H 9/145* (2006.01)
  *H03H 9/70* (2006.01)
  *H03H 9/72* (2006.01)
(52) U.S. Cl.
  CPC ................ *H03H 9/70* (2013.01); *H03H 9/725* (2013.01); *H03H 9/72* (2013.01)

(56) References Cited

U.S. PATENT DOCUMENTS

| | | | |
|---|---|---|---|
| 7,589,453 | B2 | 9/2009 | Meister et al. |
| 2004/0086740 | A1 | 5/2004 | Fujimoto et al. |
| 2004/0174233 | A1 | 9/2004 | Takayama et al. |
| 2004/0256950 | A1 | 12/2004 | Hada et al. |
| 2006/0290233 | A1 | 12/2006 | Nishiyama et al. |
| 2007/0046400 | A1 | 3/2007 | Wada et al. |
| 2007/0096592 | A1 | 5/2007 | Kadota et al. |
| 2007/0241841 | A1 | 10/2007 | Hauser et al. |
| 2007/0284965 | A1 | 12/2007 | Kadota et al. |
| 2008/0303379 | A1 | 12/2008 | Nakai et al. |
| 2008/0309192 | A1 | 12/2008 | Nakao et al. |
| 2009/0009263 | A1* | 1/2009 | Javid et al. .................. 333/133 |
| 2009/0051457 | A1 | 2/2009 | Bauer et al. |
| 2009/0058225 | A1 | 3/2009 | Kadota |
| 2009/0072659 | A1 | 3/2009 | Nishiyama et al. |
| 2009/0085429 | A1 | 4/2009 | Nishiyama et al. |
| 2009/0096320 | A1 | 4/2009 | Yaoi et al. |
| 2009/0115287 | A1 | 5/2009 | Kando |
| 2009/0121810 | A1 | 5/2009 | Fujii et al. |
| 2009/0174284 | A1* | 7/2009 | Mimura et al. .......... 310/313 A |
| 2009/0265904 | A1 | 10/2009 | Kando et al. |
| 2009/0289740 | A1 | 11/2009 | Takamine |
| 2009/0289745 | A1 | 11/2009 | Bauer et al. |
| 2009/0302709 | A1 | 12/2009 | Mimura |
| 2010/0033055 | A1 | 2/2010 | Nakatani |
| 2010/0109802 | A1 | 5/2010 | Tanaka |
| 2010/0277036 | A1* | 11/2010 | Shimizu et al. .......... 310/313 B |

FOREIGN PATENT DOCUMENTS

| | | | |
|---|---|---|---|
| DE | 10 2006 057 340 | A1 | 6/2008 |
| JP | 1220910 | A | 9/1989 |
| JP | 722898 | A | 1/1995 |
| JP | 2000196409 | A | 7/2000 |
| JP | 2004153654 | A | 5/2004 |
| JP | 2005005763 | A | 1/2005 |
| JP | 2005518127 | A | 6/2005 |
| JP | 2006115548 | A | 4/2006 |
| JP | 2007060108 | A | 3/2007 |
| JP | 2008522514 | A | 6/2008 |
| JP | 2009267904 | A | 11/2009 |
| JP | 2010045533 | A1 | 2/2010 |
| JP | 2010109694 | A | 5/2010 |
| WO | WO 2005/036744 | A1 | 4/2005 |
| WO | 2005083881 | A1 | 9/2005 |
| WO | 2005093949 | A1 | 10/2005 |
| WO | 2006114930 | A1 | 11/2006 |
| WO | 2007097186 | A1 | 8/2007 |
| WO | 2007108269 | A1 | 9/2007 |
| WO | 2007138844 | A1 | 12/2007 |
| WO | 2007145057 | A1 | 12/2007 |
| WO | 2008038481 | A1 | 4/2008 |
| WO | 2008087836 | A1 | 7/2008 |
| WO | 2008108113 | A1 | 9/2008 |
| WO | 2008108215 | A1 | 9/2008 |
| WO | 2009098840 | A1 | 8/2009 |

OTHER PUBLICATIONS

Bergmann, A., et al., "High Selectivity SAW Duplexer for W-CDMA Band VIII," IEEE Ultrasonics Symposium, Nov. 2-5, 2008, pp. 590-593.

"Single crystal wafers for surface acoustic wave (SAW) device applications—Specifications and measuring methods," International Standard, IEC 62276, 1st Edition, May 2005, 34 pages.

Kadota, M., "High Performance and Miniature Surface Acoustic Wave Devices with Excellent Temperature Stability Using High Density Metal Electrodes," IEEE Ultrasonics Symposium, Oct. 28-31, 2007, pp. 496-506.

Kadota, M., et al., "SAW Duplexer for PCS in US with Excellent Temperature Stability," IEEE Ultrasonics Symposium, Oct. 5-8, 2003, pp. 2105-2109.

Kadota, M., et al., "SAW Substrate with Coupling Factor and Excellent Temperature Stability suitable for Duplexer of PCS in US," IEEE International Ultrasonics, Ferroelectrics, and Frequency Control Joint 50th Anniversary Conference, Aug. 23-27, 2004, pp. 1970-1975.

Kadota, M., et al., "Small (3×2.5mm$^2$) Surface Acoustic Wave Suplexer for W-CDMA with Good Temperature and Frequency Characteristics," IEEE Ultrasonics Symposium, Oct. 28-31, 2007, pp. 1677-1680.

Kadota, M., et al., "Surface Acoustic Wave Filter in High Frequency Range with Narrow Bandwidth and Excellent Temperature Property," IEEE International Ultrasonics Symposium Proceedings, Nov. 2-5, 2008, pp. 1584-1587.

Lin, C.S., et al., "Diffusional Breakdown of a Ag Diffusion Barrier in a Cu—Ag—Ni Diffusion Triple," Metallurgical Transactions, vol. 17A, Jun. 1986, pp. 933-944.

Marksteiner, S., et al., "Hybrid SAW/BAW System-in-Package Integration for Mode-Converting Duplexers," Third International Symposium on Acoustic Wave Devices for Future Mobil Communication Systems, 2007, pp. 97-100.

Nakai, Y., et al., "Surface Acoustic Wave Duplexer composed of $SiO_2$ film with Convex and Concave on Cu-electrodes/$LiNbO_3$ Structure," IEEE Ultrasonics Symposium, Nov. 2-5, 2008, pp. 1580-1583.

Nakamura, H., et al., "A Small-sized SAW Duplexer on a $SiO_2$/IDT/$LiNbO_3$ structure for Wideband CDMA Application," IEEE Ultrasonics Symposium, Oct. 28-31, 2007, pp. 488-491.

Nakamura, H., et al., "Suppression of Transverse Mode Spurious in SAW Resonators on an $SiO_2$/Al/$LiNbO_3$ Structure for Wideband CDMA Applications," IEEE Ultrasonics Symposium, Nov. 2-5, 2008, pp. 594-597.

Nakanishi, H., et al., "Small-sized SAW Duplexers with Wide Duplex Gap on a $SiO_2$/Al/$LiNbO_3$ structure by using Novel Rayleigh-mode Spurious Suppression Technique," IEEE International Ultrasonics Symposium Proceedings, Nov. 2-5, 2008, pp. 1588-1591.

Nakao, T., et al., "Small 3×2.5mm$^2$ sized Surface Acoustic Wave Suplexer for US-PCS with Excellent Temperature and Frequency Characteristics," IEEE Ultrasonics Symposium, Oct. 28-31, 2007, pp. 1681-1684.

Naumenko, N., et al., "Optimal cut of lithium niobate with suppressed Rayleigh-type mode for application in resonator SAW filters," IEEE International Ultrasonics Symposium Proceedings, Nov. 2-5, 2008, pp. 1013-1017.

Shimizu, H., et al., "Love-Type-SAW Resonator of Small Size with Very Low Capacitance Ratio and Its Application to VCO," IEEE Ultrasonics Symposium, vol. 1, Dec. 4-7, 1990, pp. 103-108.

Takayama, R., et al., "Advancement of SAW Duplexer by Using $SiO_2$," Third International Symposium on Acoustic Wave Devices for Future Mobil Communication Systems, 2007, pp. 139-144.

Takayama, R., et al., "US-PCS SAW Duplexer using high-Q SAW resonator with $SiO_2$ coat for stabilizing temperature characteristics," IEEE International Ultrasonics, Ferroelectrics, and Frequency Control Joint 50th Anniversary Conference, vol. 2, Aug. 23-27, 2004, pp. 959-962.

Wright, P.V., "A Review of Saw Resonator Filter Technology," IEEE Ultrasonics Symposium, vol. 1, Oct. 20-23, 1992, pp. 29-38.

* cited by examiner

COMPONENT WORKING WITH ACOUSTIC WAVES HAVING REDUCED TEMPERATURE COEFFICIENT OF FREQUENCIES AND METHOD FOR PRODUCING SAME

This patent application is a national phase filing under section 371 of PCT/EP2011/062754, filed Jul. 25, 2011, which claims the priority of German patent application 10 2010 034 121.5, filed Aug. 12, 2010, each of which is incorporated herein by reference in its entirety.

TECHNICAL FIELD

The invention relates to components working with acoustic waves having a reduced temperature coefficient of frequencies, and to methods for producing corresponding components.

BACKGROUND

Components working with acoustic waves, for example SAW components (SAW=Surface Acoustic Wave), GBAW components (GBAW=Guided Bulk Acoustic Wave) or BAW components, (BAW=Bulk Acoustic Wave), can be used in radio-frequency circuits, e.g., in bandpass filters. For this purpose, they comprise a piezoelectric material and also electrode structures. The electrode structures convert an RF signal into acoustic waves that propagate in the piezoelectric material, however, electrode structures also convert acoustic waves into RF signals. In general, it is desirable to avoid leaky wave losses and the excitation of interference modes, and to obtain an electroacoustic coupling coefficient $\kappa^2$ high enough for the bandwidth of the application, and a smallest possible temperature coefficient of frequencies.

Bandpass filters working with acoustic waves can be used, for example, as reception filters or as transmission filters, for example in a duplexer. Such bandpass filters are intended to have a low insertion loss in the passband, a high stop band suppression outside the passband, and also a high performance. Furthermore, they are intended to be producible with a small component size and in a cost-effective manner.

International Patent publication No. WO 2005/036744 A1, for example, discloses a component working with acoustic waves comprising an $LiNbO_3$ substrate ($LiNbO_3$=lithium niobate). Finger-shaped electrode structures are arranged between the substrate and an $SiO_2$ layer.

The requirements made of components working with acoustic waves constantly increase. In particular, the usable frequency range of a passband is intended to be as wide as possible and that of the transition range from the passband to the stop band is intended to be as narrow as possible. The stop band suppression is intended to be improved, and the temperature coefficient of frequencies (TCF) is intended to be minimized. The temperature coefficient of frequencies designates the temperature dependence of the frequency-dependent attenuation characteristic of a filter. The undesirable effects of the temperature coefficient are temperature-dependent shifts of, for example, the passbands of bandpass filters.

Furthermore—in accordance with the continuous trend toward miniaturization—corresponding components are intended to be able to be made smaller than known components.

SUMMARY OF THE INVENTION

In one aspect, the present invention specifies firstly a component working with acoustic waves which fulfills such requirements better than known components, and secondly a method for producing such a component.

A component working with acoustic waves is specified which comprises a piezoelectric substrate, a lower adhesion layer, an electrode layer, an upper adhesion layer, a compensation layer and a trimming layer. In this case, the lower adhesion layer is arranged above the substrate. The electrode layer comprises comb-shaped, interdigital electrode fingers of two electrodes and is arranged above the lower adhesion layer. The upper adhesion layer is arranged above the electrode fingers. The compensation layer reduces the temperature coefficient of frequencies of the component or the electroacoustic coupling coefficient, that is to say reduces the obtainable bandwidth of a filter component. The compensation layer is arranged between the electrode fingers and also in a covering manner on the electrode fingers. The trimming layer sets a desired frequency range and is arranged above the compensation layer.

The invention therefore specifies a layer construction for a component working with acoustic waves, which layer construction is well suited to fulfilling the abovementioned requirements and has a reduced TCF, in particular. In this case, the electrode fingers of the two electrodes of the electrode layer are provided firstly for converting RF signals into acoustic waves and secondly for converting acoustic waves into RF signals. The lower adhesion layer makes it possible to apply the electrode fingers of the electrode layer with a high quality on the substrate, which can be advantageous for the performance and for the finger resistance. The upper adhesion layer, arranged above the electrode fingers, makes it possible in a simple manner to connect the compensation layer to the electrode layer.

The compensation layer reduces the temperature coefficient of frequencies of the component: in a periodic normal finger grid, the distance—as seen in the propagation direction of the acoustic waves—of the finger centers of fingers situated alongside one another corresponds to half the wavelength $\lambda/2$ of the acoustic wave. The corresponding frequency range of the component is substantially reciprocal to the wavelength $\lambda$ and proportional to the propagation speed of the acoustic waves. The propagation speed of the acoustic waves is dependent, inter alia, on the moduli of elasticity of the materials used and the mass coverings of the acoustic tracks. In particular the moduli of elasticity—the elastic components of the materials used—are dependent on temperature. Consequently, the frequency range of the component is also dependent—generally undesirably—on temperature. However, a bandpass filter working with acoustic waves is intended to fulfill required specifications in a wide temperature range. Accordingly, the compensation layer is provided for reducing, and if appropriate eliminating, the temperature coefficient of frequencies of the component. The compensation layer affects the elastic components of the other layers and thus reduces the temperature coefficient.

As already indicated above, the frequency range is also dependent on the mass covering of the component. In order to be able to compensate for fluctuations in the mass covering during the production process, a trimming layer is arranged above the compensation layer. The thickness of the trimming layer and thus the mass covering of the component can already be reduced during production in a processing step, a trimming step, following the production of the layer construction, in order to set a desired frequency range.

Material of the lower or upper adhesion layer, of the compensation layer or of the trimming layer can be arranged between the electrode fingers of the electrodes that are arranged alongside one another.

Such a component makes possible filters having a low relative bandgap, having a high relative bandwidth, having a high edge steepness, having a high performance, a sufficiently piezoelectric coupling coefficient and low temperature coefficient and manufacturing processes with little manufacturing variations; such a component makes possible filter circuits or filter components which can be produced cost-effectively and which successfully fulfill the specifications for insertion loss, selection and isolation.

In one embodiment, the substrate is piezoelectric or pyroelectric and comprises chemically reduced $LiNbO_3$ (lithium niobate). The chemical reduction increases the conductivity and minimizes electrical discharge on account of the pyroelectric effect during component manufacture, in particular during the sputtering process for producing the compensation layer, and during operation. Moreover, the chemically reduced substrate is less transparent ("black"), as a result of the increased optical absorption in the near UV range, which has a positive effect on the process for producing the electrode structure by means of photolithography. The lower and upper adhesion layers comprise Ti (titanium). The electrode fingers comprise Cu (copper) and/or Ag (silver). The compensation layer comprises $SiO_2$ (silicon dioxide) or some other silicon oxide, and the trimming layer comprises $Si_3N_4$ (silicon nitride). The $Si_3N_4$ of the trimming layer can simultaneously act as a passivation layer of the component. This embodiment specifies a material combination which makes possible a component having a particularly high performance and makes possible a low temperature coefficient of frequencies of the component owing to the use of $SiO_2$ in the compensation layer.

The compensation layer, for example a $SiO_2$ layer, can be applied to the electrode fingers by a single-layer sputtering process and subsequently be smoothed.

In one embodiment, the substrate has a surface normal which is perpendicular to the crystallographic X-axis and which forms an angle of 127.85±5° with the Y-axis of the substrate. The lower adhesion layer has a thickness of between 3 nm and 8 nm. The electrode layer has a thickness of between 130 nm and 190 nm. The upper adhesion layer here has a thickness of between 3 nm and 8 nm. The compensation layer can have a thickness of between 25% and 45% of the acoustic wavelength. The trimming layer has a thickness of between 30 nm and 110 nm. The lower or upper adhesion layer can comprise Ti.

The lower adhesion layer can have a thickness of 5 nm, and the upper adhesion layer can likewise have a thickness of 5 nm.

The electrode layer can comprise a silver layer having a thickness of 2 nm and a copper layer having a thickness of 170 nm. The metallization ratio of the electrode layer, $\eta$, can be between 0.5 and 0.58. By way of example, the metallization ratio of the electrode layer, $\eta$, can be 0.54 for a transmission filter and 0.56 for a reception filter. It is also possible for $\eta=0.51$ for the transmission filter and $\eta=0.53$ for the reception filter.

The thickness of the compensation layer can be 7% of the thickness of the electrode layer.

It is possible to apply a 100 nm thick layer as the trimming layer and, after trimming, to strive for an approximately 45 nm thick trimming layer that shall remain. For this purpose, the metallization height and thus also the mass loading brought about solely by the electrode layer itself are set to be correspondingly low.

In one embodiment, the substrate has a surface normal which is perpendicular to the crystallographic X-axis of the substrate and forms an angle of 127.85±5° with the Y-axis.

The thickness of the lower and upper adhesion layers is between 3 nm and 8 nm. The adhesion layers can comprise titanium. The thickness of the electrode layer and the thickness of the compensation layer are optimally coordinated with one another in order to obtain a good temperature compensation and a sufficient electroacoustic coupling coefficient. Furthermore, any strong excitation of a Rayleigh surface wave is obtained and possible sear waves are effectively suppressed. For this purpose, the electrode material comprises Cu and the compensation layer comprises $SiO_2$. The thickness of the electrode layer is between 5% and 15% of the acoustic wavelength $\lambda$, and the thickness of the compensation layer is between 25% and 45% $\lambda$. $Si_3N_4$ is appropriate as material of the trimming layer. The relative layer thickness thereof of up to 5% of the wavelength $\lambda$ suffices to be able to compensate for production-dictated fluctuations in the frequency range by subsequent removal/trimming.

As a result of the high bending stiffness of $Si_3N_4$, it is thereby possible, without significant reduction of electroacoustic coupling—and thus without significant reduction of the bandwidth of a corresponding filter element—to correct the frequency range of the component by up to approximately 10 000 ppm upward.

In an embodiment for application in the case of W-CDMA (UMTS) Band II signals (Tx: 1850-1910 MHz, Rx: 1930-1990 MHz) having a relative bandwidth of 3.2%, the layer thickness of the electrode layer composed of Cu is preferably 140 nm, the layer thickness of the compensation layer composed of $SiO_2$ is 590 nm and the layer thickness of the trimming layer composed of $Si_3N_4$ is between 15 nm and 75 nm. In order to increase the performance, the electrode layer can comprise a partial layer composed of Ag having a thickness of up to 10 nm.

In an embodiment for application in the case of W-CDMA (UMTS) Band III signals (Tx: 1710-1785 MHz, Rx: 1805-1880 MHz) having a relative bandwidth of 4.2%, the layer thickness of the electrode layer composed of Cu is preferably 140 nm, the layer thickness of the compensation layer composed of $SiO_2$ is 590 nm and the layer thickness of the trimming layer composed of $Si_3N_4$ is between 15 nm and 75 nm. In order to increase the performance, the electrode layer can comprise a partial layer composed of Ag having a thickness of up to 10 nm.

In an embodiment for application in the case of W-CDMA (UMTS) Band VII signals (Tx: 2500-2570 MHz, Rx: 2620-2690 MHz) having a relative bandwidth of 2.7%, the layer thickness of the electrode layer composed of Cu is preferably 140 nm, the layer thickness of the compensation layer composed of $SiO_2$ is 540 nm and the layer thickness of the trimming layer composed of $Si_3N_4$ is between 15 nm and 75 nm. In order to increase the performance, the electrode layer can comprise a partial layer composed of Ag having a thickness of up to 10 nm.

In an embodiment for application in the case of W-CDMA (UMTS) Band VIII signals (Tx: 880-915 MHz, Rx: 925-960 MHz) having a relative bandwidth of 3.8%, the layer thickness of the electrode layer composed of Cu is preferably 250 nm, the layer thickness of the compensation layer composed of $SiO_2$ is 1200 nm and the layer thickness of the trimming layer composed of $Si_3N_4$ is between 20 nm and 100 nm. In order to increase the performance, the electrode layer can comprise a partial layer composed of Ag having a thickness of up to 10 nm.

In an embodiment for application in the case of ISM signals (2400-2483 MHz) having a relative bandwidth of 3.4%, the layer thickness of the electrode layer composed of Cu is preferably 130 nm, the layer thickness of the compensation layer composed of SiO$_2$ is 470 nm and the layer thickness of the trimming layer composed of Si$_3$N$_4$ is between 15 nm and 75 nm.

In order to increase the performance, the electrode layer can comprise a partial layer composed of Ag having a thickness of up to 10 nm.

The metallization ratio η of the electrode fingers can be between 0.50 and 0.58. The metallization ratio for W-CDMA (UMTS) Band II signals can be 0.54 for the transmission filter and 0.56 for the reception filter.

The metallization ratio for W-CDMA (UMTS) Band III signals can be 0.51 for the transmission filter and 0.53 for the reception filter.

The metallization ratio for W-CDMA (UMTS) Band VII signals can be approximately 0.52.

The metallization ratio for W-CDMA (UMTS) Band VIII signals can be approximately 0.55.

The metallization ration for ISM signals can be approximately 0.52.

One such piezo-substrate is a so-called LN128 substrate, where LN stands for lithium niobate. Such a piezoelectric substrate makes possible a good piezoelectric coupling, that is to say a high coupling coefficient $\kappa^2$. It furthermore makes possible a component having low losses, for example leaky wave losses, and also having a low susceptibility to interference mode excitations.

Another possibility for defining such a crystal cut of an LiNbO$_3$ substrate consists in specifying the Eulerian angles: ($\lambda=0°$, $\mu=37.85°\pm5°$, $\theta=0°$).

In this case, the Eulerian angles are defined as follows: firstly, a set of axes x, y, z are taken as a basis, which are the crystallographic axes of the substrate.

The first angle, $\lambda$, specifies by what magnitude the x-axis and the y-axis are rotated about the z-axis, the x-axis being rotated in the direction of the y-axis. A new set of axes x', y', z' correspondingly arises, wherein z=z'.

In a further rotation, the z'-axis and y'-axis are rotated about the x'-axis by the angle $\mu$. In this case, the y'-axis is rotated in the direction of the z'-axis. A new set of axes x", y", z" correspondingly arises, wherein x'=x".

In a third rotation, the x"-axis and the y"-axis are rotated about the z"-axis by the angle $\theta$. In this case, the x"-axis is rotated in the direction of the y"-axis. A third set of axes x''', y''', z''' thus arises, wherein z"=z'''.

In this case, the x'''-axis and the y'''-axis are parallel to the surface of the substrate. The z'''-axis is the normal to the surface of the substrate. The x'''-axis specifies the propagation speed of the acoustic waves.

The definition is in accordance with the International Standard IEC 62276, 2005-05, Annex A1.

Such a crystal cut makes it possible to excite highly coupling Rayleigh modes.

Such a component can comprise a bandpass filter or a band-stop filter, for example a notch filter. Furthermore, such a component can comprise a transmission filter or a reception filter for a mobile communication device. A corresponding component can additionally comprise a balun functionality (balun=balanced ↔ unbalanced converter) and convert, for example, unbalanced-to-ground RF signals into balanced-to-ground signals or balanced-to-ground signals into unbalanced-to-ground signals.

In one embodiment, the component comprises an antenna connection, a transmission signal connection and a reception signal connection. A transmission filter working with acoustic waves is interconnected between the antenna connection and the transmission signal connection. A reception filter working with acoustic waves is interconnected between the antenna connection and the reception signal connection. The transmission filter and the reception filter are arranged on the same side of the substrate. Such a component constitutes a duplexer. In particular, such a component constitutes a one-chip duplexer, which can be produced more cost-effectively in comparison with two-chip solutions because patterning steps for transmission and reception filters can be carried out on the same substrate surface. Moreover, a smaller component size can be obtained.

The transmission filter and the reception filter of the duplexer can comprise different layer thicknesses of the layer construction and different additional functional layers. The transmission filter and the reception filter can then be produced by means of successively sequential patterning steps. However, it is also possible for the layer construction of the reception filter to correspond to the layer construction of the transmission filter. In that case, both filters can be produced simultaneously and during the same patterning steps in a particularly simple manner.

In one embodiment of the duplexer, the transmission filter of the duplexer comprises a ladder-type filter. The reception filter of the duplexer comprises a DMS filter. Relatively high powers, for instance of the order to magnitude of 1 W=30 dbm, are transmitted in the transmission filter. Ladder-type filters have a particularly high performance and are therefore particularly suitable for use in transmission filters. A reception filter generally needs good isolation of the transmission path from the reception path, a low insertion loss in the passband and a high selection, that is to say high stop band suppression outside the passband. DMS filters have good isolation and high selection. DMS filters are therefore well suited to use in reception filters. Additional resonators in a ladder-type configuration can be interconnected between the DMS filter of the reception filter and the reception filter input by which the reception filter can be interconnected with the transmission filter.

Components with an integrated balun are advantageous for the combination of filter and duplexer components with amplifiers integrated in a transceiver and with front-end architectures on a CMOS basis.

If the conversion of a signal that is unbalanced relative to ground is realized in the form of an impedance converter as balun, this converter can be arranged either between the common Tx/Rx line leading to the antenna and the Rx filter or downstream of the unbalanced Rx filter. In both cases, however, the conversion can be associated with a signal loss, the causes of which are a mismatch and internal losses of the balun. In order to avoid or reduce such balancing losses, an Rx filter can comprise a bandpass filter with an integrated balun. The signal balancing is effected by connecting DMS resonators. DMS resonators achieve, particularly in the left edge, high edge steepness and additionally high isolation values with respect to the Tx filter. Furthermore, high power loadings are not required. Therefore, such resonators are well suited to use in Rx filters.

In one configuration of this embodiment, the ladder-type filter of the transmission filter has resonators having a cosinusoidal overlap weighting. The DMS filter of the reception filter has a multiple overlap weighting.

In this case, the term overlap weighting denotes the fact that the overlap length of electrode fingers of adjacent electrode fingers changes along the propagation direction of the acoustic waves, the x''' direction. In the case of cosinusoidal overlap weighting, the overlap changes in accordance with the cosign function. In this case, the coordinate origin can be arranged, in principle, everywhere within the corresponding converter.

In order to increase the performance, the resonators can be embodied in a serially cascaded fashion. In order to obtain a matched impedance, a quadrupled area covering is necessary. Thus, the acoustic power density is approximately quartered and the voltage present at the interdigital transducers is halved. In order that excessively large apertures need not be used, it is possible to configure the resonators such that they are longer. In order to make possible an effective overlap weighting, long resonators having a high aspect ratio, for instance length/width ≥5, can be avoided. Instead, the resonators can be separated by a short reflector and arranged as a relay, e.g., as a 2×2 or 2×3 relay.

The DMS filter has a multiple overlap weighting. That means that the electrode overlap changes along the propagation direction of the acoustic waves. In this case, the variable overlap has a periodic structure along the propagation direction. The overlap weighting of the DMS filter can also be cosinusoidal.

A weakly pronounced sinusoidal multiple weighting of less than 50% is advantageous for the interdigital transducers of the DMS structure having a low aspect ratio, for instance length/width <1. Thus, the overlap function in the transition regions between the transducers, that is to say in the regions of high acoustic power density, is continuous and the resulting transfer function can be better simulated.

The number of periods for the sinusoidal weighting in the DMS filter can be greater than or equal to the number of transducers in the DMS filter.

By means of an overlap weighting, in a transducer working with acoustic waves, a sufficient suppression of transverse effects is obtained or the ripple of the insertion loss in the passband is reduced. In particular, such a configuration of the duplexer exhibits a good correspondence to the simulation model used in the development of the duplexer. As a result, iteration steps of the simulation can be saved during the development of the filters.

In one embodiment of the component, the compensation layer is arranged exclusively above acoustically active regions of the substrate. Acoustically inactive regions of the substrate remain uncovered by the compensation layer.

The compensation layer can be applied to the substrate by means of a sputtering process and patterned by means of a lithography process. In this case, the contact points for later contact-making externally are freed of the layer and only acoustically active regions plus required safety distances remain covered with the compensation layer, and also, if necessary, regions of conductor track crossovers. Conductor track crossovers are preferably constructed by a compensation layer arranged in the overlap region between the electrode layers or a further metal layer. In order to minimize the requirement for chip area, the regions of conductor track crossovers can be arranged directly at the busbars laterally with respect to the acoustically active regions.

The positive effect resulting from the patterning performed minimizes mechanical strains between the compensation layer and the substrate. As already explained above, the compensation layer reduces the temperature coefficient of frequencies of the component. The frequency range of the component is dependent on the frequency response of the elastic components, for example the moduli of elasticity of the corresponding materials. An $SiO_2$ layer has, for example, a temperature coefficient of the elastic components which runs counter to the temperature coefficient of lithium niobate $LiNbO_3$. Although, on the one hand, that makes the temperature compensations possible, on the other hand, thermally induced stresses thereby arise in the composite composed of substrate and compensation layer. By virtue of the fact that the compensation layer is applied precisely where acoustic waves propagate in the substrate, temperature compensation and fewer thermal stresses outside this region are obtained.

In one embodiment of the component, the electrode layer has a layer comprising Ag (silver) and a layer comprising Cu (copper) arranged on the layer comprising Ag.

As a result of such a material selection, it is possible to achieve a significantly reduced acoustomigration and, as a result, an increased lifetime of the component. Furthermore, it is possible to set the abovementioned mass covering in a suitable manner in order to obtain a desired propagation speed of the acoustic wave. A propagation speed that varies in a transverse direction makes it possible to form a waveguide in which acoustic waves can propagate optimally.

In a component, it is possible to thicken lead connections and signal lines on a piezoelectric substrate in order to reduce the lead losses and in order to protect the surface of the conductors with one or more further metal layers, for example Ti or Al. The further metal layer can completely cover the electrode layer outside the acoustically active regions and overlap the compensation layer or be overlapped by the compensation layer.

The component can comprise an HTCC or LTCC multilayer substrate, on which a piezoelectric chip carrying the acoustic component structures is arranged. Capacitive, inductive or resistive elements can be patterned in metallization layers within the multilayer substrate.

A method for producing a component working with acoustic waves comprises the following steps:
providing a substrate,
depositing a lower adhesion layer onto the substrate,
patterning comb-shaped, interdigital electrode fingers in an electrode layer on the lower adhesion layer,
depositing an upper adhesion layer onto the electrode fingers,
depositing a compensation layer onto the exposed regions of substrate, lower adhesion layer, electrode fingers and upper adhesion layer,
depositing a trimming layer onto the compensation layer,
setting a desired frequency range of the component by thinning the trimming layer.

The compensation layer, the lower adhesion layer, the electrode fingers, the upper adhesion layer and the trimming layer can be congruent. An adhesion layer can be arranged in an insulating fashion and then also in the region between the electrodes. However, it is also possible for the lower adhesion layer, the upper adhesion layer or the compensation layer also to be arranged in regions between electrode fingers.

By means of these method steps, it is possible to produce a multiplicity of components on a wafer. The individual components can be singulated after production by the wafer being sawn apart, cut apart or divided, e.g., by means of a laser.

The desired frequency range of the component can be set by each of the components being measured individually and being trimmed/thinned individually in the trimming step.

However, it is also possible for individual components from a multiplicity of components situated on the wafer to be measured with regard to the frequency range and for the trimming layer, which covers all the components and is deposited beforehand on the entire surface of the wafer, to be thinned in a spatially resolved manner, e.g., by means of ion beam etching. It is possible to measure individual components arranged at a characteristic location and to interpolate a deviation of the frequency over the wafer area.

One embodiment of the method furthermore comprises the following steps:

spin-coating a resist layer (LS) having a planar surface onto the compensation layer (KS), curing the resist layer (LS), etching the resist layer (LS) until the underlying compensation layer (KS) is partly exposed, etching the resist layer and the exposed part of the compensation layer (KS) until the resist layer is completely removed.

In this case, the etching conditions are set such that the cured resist layer and the compensation layer have the same etching rate.

A component having a particularly low surface roughness of the compensation layer and a layer stack surface parallel to the x'''-y''' plane can thus be obtained.

In a further embodiment, the method furthermore comprises the following steps:

producing a trimming layer on the compensation layer, measuring the frequency range of the component after producing the trimming layer, removing a partial layer of the trimming layer.

In this case, the thickness of the partial layer to be removed is dimensioned in a manner dependent on the difference between the measured frequency range and a desired frequency range.

In this case, the thickness of the partial layer to be removed is dependent on the difference between the measured frequency range and a desired frequency range. The trimming of the components can be carried out for a multiplicity of components arranged on a wafer in a spatially resolved manner and accurately in respect of frequency.

BRIEF DESCRIPTION OF THE DRAWINGS

The component is explained in greater detail below on the basis of exemplary embodiments and associated schematic figures.

DETAILED DESCRIPTION OF ILLUSTRATIVE EMBODIMENTS

Figure 1:
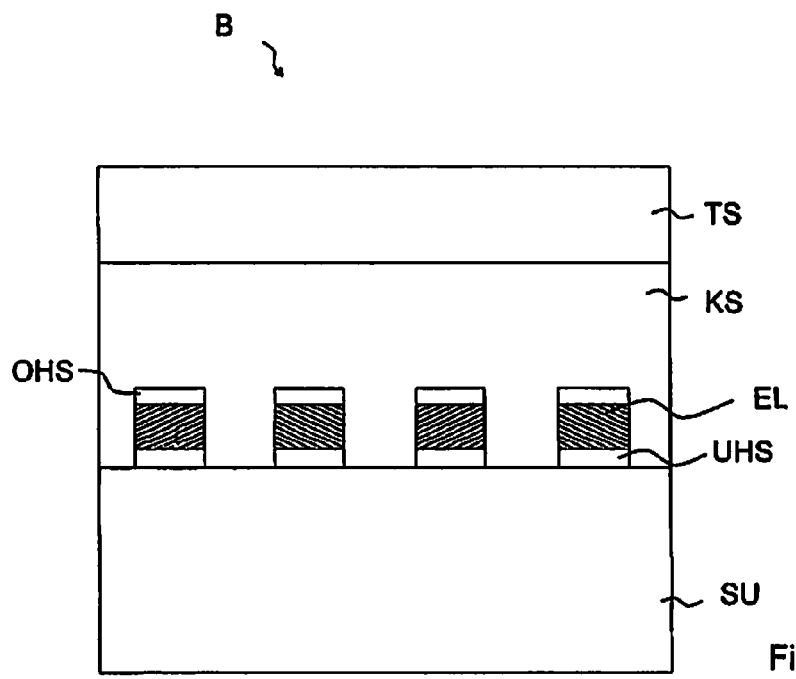
FIG. 1 shows a cross section along the propagation direction of the acoustic waves through a component.

FIG. 1 shows a cross section through a component B working with acoustic waves along the propagation direction x''' of the acoustic waves. The component B comprises a substrate SU. A lower adhesion layer UHS is arranged on the substrate SU. A compensation layer KS is arranged above the lower adhesion layer UHS. An electrode layer EL is arranged between the lower adhesion layer UHS and the compensation layer KS. Electrode fingers EF of two electrodes are patterned in the electrode layer EL. Two differently oriented hatchings of the electrode fingers EF show the association with the different electrodes. An upper adhesion layer OHS is arranged above the electrode fingers EF and below the compensation layer KS. The upper adhesion layer OHS imparts a good mechanically stable connection between the electrode layer EL and the compensation layer KS. The compensation layer is arranged between the electrode layer EL and the trimming layer TS.

The electrode fingers EF of different electrodes are electrically isolated from one another. The space between adjacent electrode fingers EF can be filled by a material selected from at least one of the lower adhesion layer UHS, the upper adhesion layer OHS and the compensation layer KS. It is possible for all these layers mentioned also to extend into the region between the electrode fingers. However, it is also possible for the space between the electrode fingers and, if appropriate, between strips of the upper adhesion layer OHS that are arranged on the electrode fingers to be empty.

The electrode layer EL can itself comprise a plurality of partial layers, which in turn comprise Ag or Cu. The lower adhesion layer or the upper adhesion layer can comprise Ti.

By means of suitable process control when applying the compensation layer, it is possible to prevent the formation of gaps between the electrode fingers; as a result of the low mechanical impedance of the gap and the correspondingly high impedance jump from electrode to gap or from compensation layer to gap, the mechanical reflection profile would otherwise generally be influenced significantly; this could lead to an increase in the manufacturing variation of the frequency range.

Figure 2:
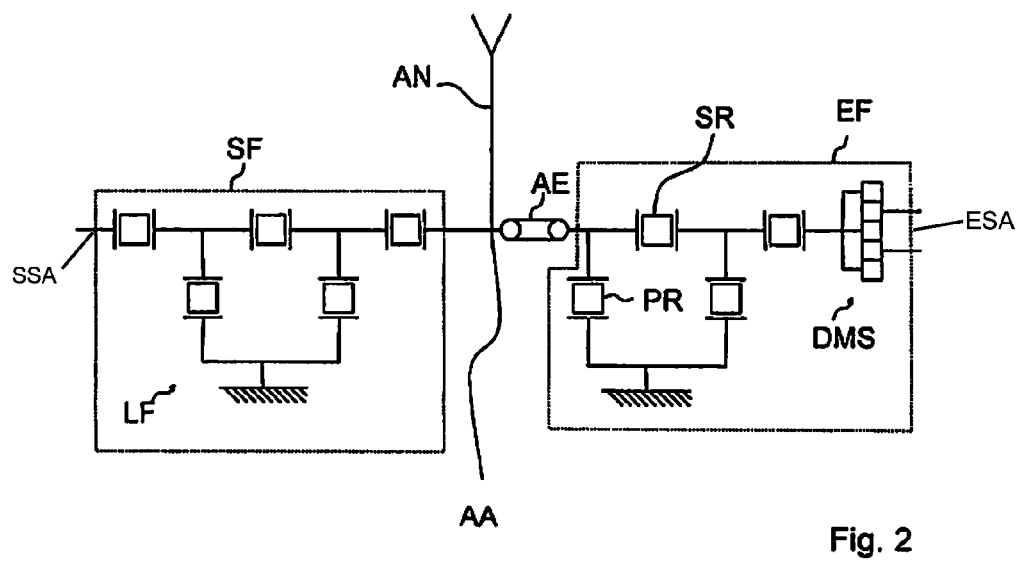
FIG. 2 shows an embodiment wherein resonators working with acoustic waves are interconnected to form a duplexer.

FIG. 2 shows how resonators working with acoustic waves of the component working with acoustic waves are interconnected to form a duplexer circuit. The circuit comprises an antenna connection AA, which can be interconnected with an antenna AN. The antenna connection is interconnected with a transmission signal connection SSA of a transmission filter SF. In addition, the antenna connection AA is interconnected with a reception signal connection ESA of a reception filter EF. The transmission filter SF comprises a ladder-type filter LF. The ladder-type filter LF comprises three resonators connected in series. Furthermore, the ladder-type filter LF comprises two parallel resonators which interconnect the series resonators with ground.

The reception filter EF comprises two basic elements of a ladder-type filter. Each basic element of a ladder-type filter comprises a series resonator SR and a parallel resonator PR. On the output side, the reception filter EF comprises a DMS filter DMS. The DMS filter comprises balun functionality and is configured as unbalanced-to-ground on the input side and balanced-to-ground on the output side.

A matching element AE for matching the impedance at the input signal connection ESA is interconnected between the antenna connection AA and the input signal connection ESA. As a result, it is possible to transform the impedance of the transmission filter to open-circuit operation.

Figure 3A:
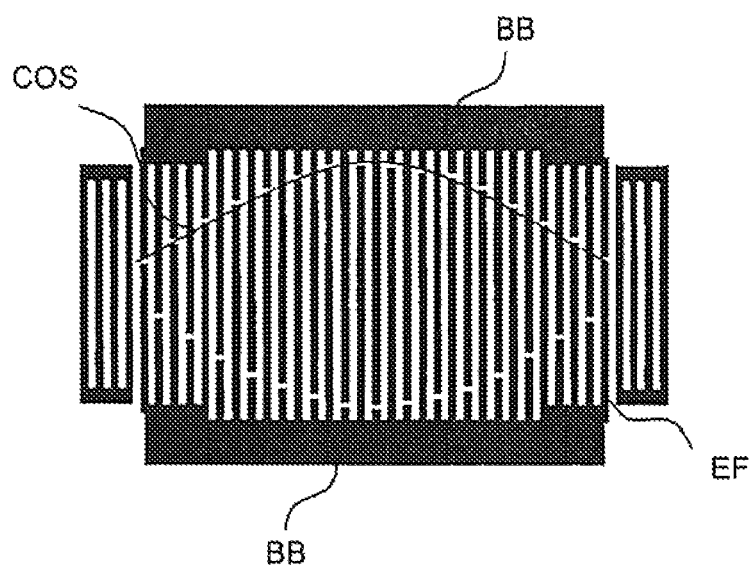
FIG. 3a shows an interdigital transducer with cosinusoidal overlap weighting.

FIG. 3a shows an interdigital transducer, e.g., an SAW or GBAW transducer, having cosinusoidal overlap weighting. Adjacent electrode fingers EF are interconnected with busbars BB situated opposite one another. The curve COS shows the cosinusoidal profile of the overlap of the electrode fingers EF. The transducer shown in FIG. 3a encompasses approximately half a period of the cosine curve. Larger or smaller proportions of the cosine curve are possible. In particular, it is possible to configure transducers with a plurality of cosine periods. In such a case of a plurality of periods, this is referred to as multiple weighting. In order to minimize the required chip area, the reflectors at the track end can be drawn in transversely inward and be tapered in a wedge-shaped fashion in the propagation direction.

Figure 3B:
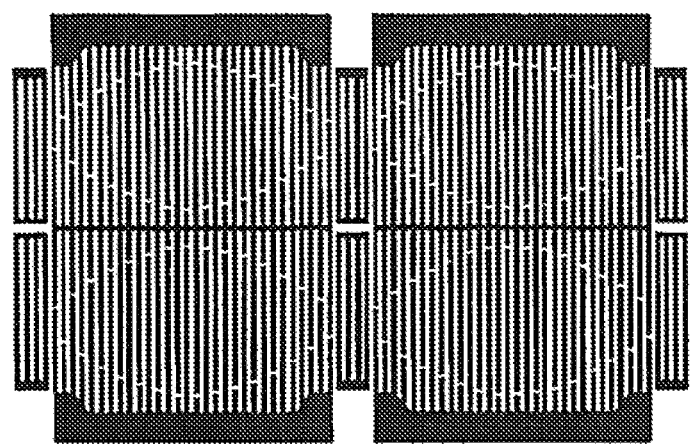
FIG. 3b shows cascaded interdigital transducers.

FIG. 3b shows a staggered arrangement of resonators. The resonators are cascaded and arranged in a manner subdivided to form a 2×2 relay for an advantageous aspect ratio. Two resonators arranged laterally alongside one another are separated by reflectors.

Figure 3C:
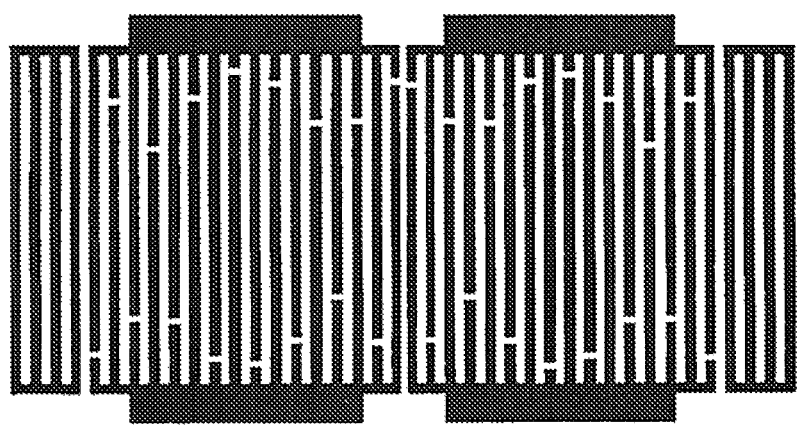
FIG. 3c shows acoustically coupled interdigital transducers with multiple weighting.

FIG. 3c shows a weighting for coupled resonators, e.g., of DMS filters. A cosinusoidal or sinusoidal multiple weighting is possible for coupled resonators having a small aspect ratio. No or acoustically partly transparent reflectors are arranged between two resonators arranged laterally alongside one another.

Figure 4:
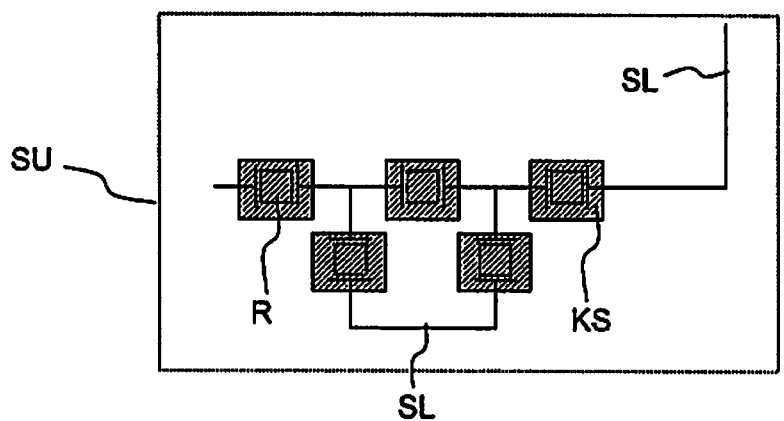
FIG. 4 shows a component in which only acoustically active regions are covered by the compensation layer.

FIG. 4 shows an arrangement of resonators R and signal lines on a substrate SU. Only the acoustically active regions, the acoustic tracks of the resonators, are covered by a coating, the compensation layer KS. Acoustically inactive regions of the substrate SU are free of the compensation layer KS in order to reduce or avoid thermally induced stresses between the substrate SU and the compensation layer KS.

Figure 5:
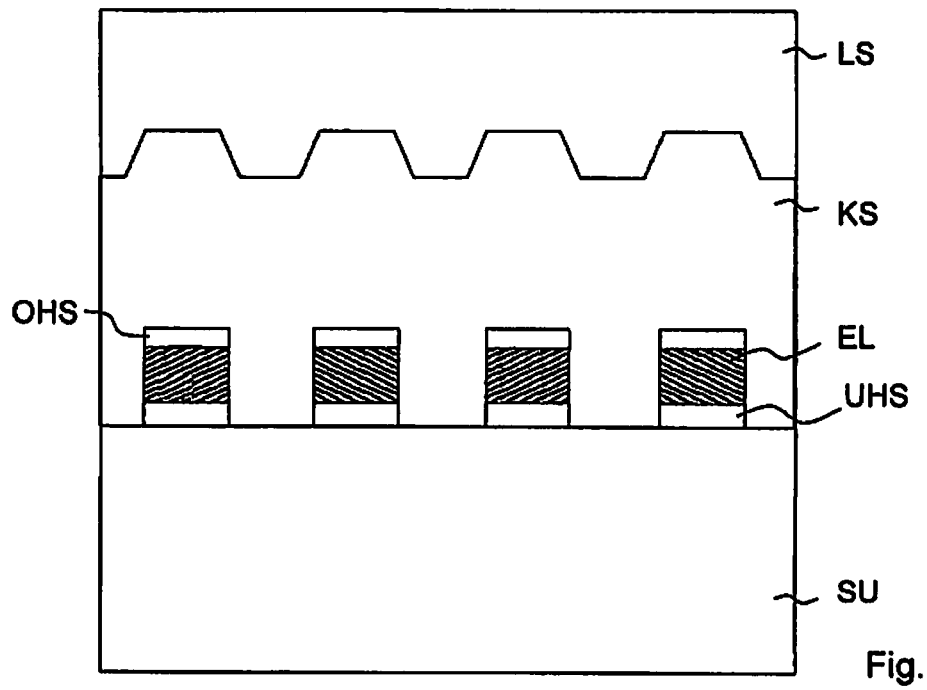
FIG. 5 shows a cross section through a component in which a resist layer is applied for the purpose of planarizing the compensation layer.

FIG. 5 shows a compensation layer having a non-planar surface. A resist layer LS is arranged on the non-planar surface. The resist layer LS nestles against the non-planar course of the surface of the compensation layer KS and itself has a planar surface. A planar surface of the resist layer LS can be obtained if the resist layer LS is spin-coated onto a component or onto a wafer having a multiplicity of components during a production process.

The resist layer and etching methods are chosen such that the resist layer in the cured state has substantially the same etching rate as the compensation layer KS. After the curing of the resist layer LS the resist layer and part of the compensation layer KS can be removed, for example by means of an etching method, e.g., a dry etching method. The removal can take place until the resist layer LS is completely removed and the planar surface of the resist layer has been transferred into the compensation layer.

A component according to the invention and a production method according to the invention are not restricted to one of the exemplary embodiments described. Combinations thereof and variations encompassing, for example, even further layer sequences or resonator structures or deposition processes or planarization or trimming processes likewise constitute exemplary embodiments according to the invention.

What is claimed is:

1. A component, comprising:
a piezoelectric substrate;
a lower adhesion layer arranged above the substrate;
an electrode layer arranged above the lower adhesion layer, the electrode layer comprising two electrodes that include comb-shaped, interdigitated electrode fingers;
an upper adhesion layer arranged above the electrode fingers;
a compensation layer between and covering the electrode fingers, the compensation layer configured to reduce a temperature coefficient of frequencies of the component; and
a trimming layer arranged above the compensation layer, the trimming layer configured to set a desired frequency range, wherein the electrode layer comprises a layer comprising Ag and a layer comprising Cu arranged over the layer comprising Ag.

2. The component according to claim 1, wherein:
the piezoelectric substrate comprises $LiNbO_3$;
the lower and the upper adhesion layers comprise Ti;
the electrode fingers comprise Cu;
the compensation layer comprises $SiO_2$; and
the trimming layer comprises $Si_3N_4$.

3. The component according to claim 2, wherein:
the substrate has a surface normal that is perpendicular to a piezo-axis and that forms an angle of 127.8±5° with a Y-axis of the substrate;
the lower adhesion layer has a thickness of between 3 nm and 8 nm;
the electrode layer has a thickness of between 5% and 15% of an acoustic wavelength;
the upper adhesion layer has a thickness of between 3 nm and 8 nm;
the compensation layer has a thickness of between 25% and 45% of the acoustic wavelength; and
the trimming layer has a thickness of up to 5% of the acoustic wavelength.

4. The component according to claim 1, wherein:
the substrate has a surface normal that is perpendicular to a piezo-axis and that forms an angle of 127.85±5° with a Y-axis of the substrate;
the lower adhesion layer has a thickness of between 3 nm and 8 nm;
the electrode layer has a thickness of between 5% and 15% of an acoustic wavelength;
the upper adhesion layer has a thickness of between 3 nm and 8 nm;
the compensation layer has a thickness of between 25% and 45% of the acoustic wavelength; and
the trimming layer has a thickness of up to 5% of the acoustic wavelength.

5. The component according to claim 1, further comprising:
an antenna connection;
a transmission signal connection;
a reception signal connection;
a transmission filter interconnected between the antenna connection and the transmission signal connection; and
a reception filter interconnected between the antenna connection and the reception signal connection, wherein the transmission filter and the reception filter are arranged on the same side of the substrate.

6. The component according to claim 5, wherein the component is a duplexer.

7. The component according to the claim 5, wherein:
the transmission filter comprises a ladder-type filter; and
the reception filter comprises a DMS filter.

8. The component according to claim 7, wherein:
the ladder-type filter of the transmission filter has resonators having a cosinusoidal overlap weighting; and
the DMS filter of the reception filter has a multiple overlap weighting.

9. The component according to claim 1, wherein the compensation layer is arranged exclusively above acoustically active regions of the substrate such that acoustically inactive regions of the substrate are not covered by the compensation layer.

10. A method for producing a component working with acoustic waves, the method comprising:
forming a lower adhesion layer over a substrate;
forming an electrode layer over the lower adhesion layer;
patterning comb-shaped, interdigital electrode fingers in the electrode layer;
forming an upper adhesion layer over the electrode fingers;
forming a compensation layer over exposed regions of the substrate, the lower adhesion layer, the electrode fingers, and the upper adhesion layer;
forming a trimming layer over the compensation layer; and thinning the trimming layer to set a desired frequency range of the component, wherein thinning the trimming layer comprises:
   measuring a frequency range of the component after forming the trimming layer; and
   removing a partial layer of the trimming layer, wherein the partial layer has a thickness dimensioned in a manner dependent on a difference between the measured frequency range and a desired frequency range.

11. The method according to claim 10, further comprising:
spin-coating a resist layer having a planar surface onto the compensation layer;
curing the resist layer;
etching the resist layer until the compensation layer is partly exposed; and
etching the resist layer and the exposed part of the compensation layer until the resist layer is completely removed, wherein etching conditions are set such that the cured resist layer and the compensation layer have about the same etching rate.

12. The method according to claim 10, wherein:
the substrate comprises $LiNbO_3$;
the lower and the upper adhesion layers comprise Ti;
the electrode fingers comprise Cu;
the compensation layer comprises $SiO_2$; and
the trimming layer comprises $Si_3N_4$.

13. The method according to claim 10, wherein the electrode layer comprises a layer comprising Ag and a layer comprising Cu arranged over the layer comprising Ag.

14. A component, comprising:
a piezoelectric substrate;
a lower adhesion layer arranged above the substrate;
an electrode layer arranged above the lower adhesion layer, the electrode layer comprising two electrodes that include comb-shaped, interdigitated electrode fingers;
an upper adhesion layer arranged above the electrode fingers;
a compensation layer between and covering the electrode fingers, the compensation layer configured to reduce a temperature coefficient of frequencies of the component;
a trimming layer arranged above the compensation layer, the trimming layer configured to set a desired frequency range;
an antenna connection;
a transmission signal connection;
a reception signal connection;
a transmission filter interconnected between the antenna connection and the transmission signal connection, wherein the transmission filter comprises a ladder-type filter, and wherein the ladder-type filter of the transmission filter has resonators having a cosinusoidal overlap weighting; and
a reception filter interconnected between the antenna connection and the reception signal connection, wherein the reception filter comprises a DMS filter, wherein the DMS filter of the reception filter has a multiple overlap weighting, and
wherein the transmission filter and the reception filter are arranged on the same side of the substrate.

15. A method for producing a component working with acoustic waves, the method comprising:
forming a lower adhesion layer over a substrate;
forming an electrode layer over the lower adhesion layer;
patterning comb-shaped, interdigital electrode fingers in the electrode layer;
forming an upper adhesion layer over the electrode fingers;
forming a compensation layer over exposed regions of the substrate, the lower adhesion layer, the electrode fingers, and the upper adhesion layer;
spin-coating a resist layer having a planar surface onto the compensation layer;
curing the resist layer;
etching the resist layer until the compensation layer is partly exposed;
etching the resist layer and the exposed part of the compensation layer until the resist layer is completely removed, wherein etching conditions are set such that the cured resist layer and the compensation layer have about the same etching rate;
forming a trimming layer over the compensation layer; and
thinning the trimming layer to set a desired frequency range of the component.

* * * * *